United States Patent [19]

Isota et al.

[11] Patent Number: 5,142,240

[45] Date of Patent: Aug. 25, 1992

[54] AMPLIFIER CIRCUIT WITH CORRECTION OF AMPLITUDE AND PHASE DISTORTIONS

[75] Inventors: Yoji Isota; Gen Toyoshima; Noriharu Suematsu; Yukio Ikeda; Tadashi Takagi; Shuji Urasaki, all of Kanagawa, Japan

[73] Assignee: Mitsubishi Denki Kabushiki Kaisha, Tokyo, Japan

[21] Appl. No.: 631,502

[22] Filed: Dec. 21, 1990

[30] Foreign Application Priority Data

Dec. 27, 1989 [JP] Japan .................................. 1-341056

[51] Int. Cl.$^5$ ............................................. H03F 1/26
[52] U.S. Cl. ..................................... 330/149; 330/107; 330/136; 328/155
[58] Field of Search ............... 307/491, 493, 262, 264, 307/511; 330/107, 110, 127, 149, 297, 302, 136; 328/155

[56] References Cited

U.S. PATENT DOCUMENTS

| | | | |
|---|---|---|---|
| 3,755,754 | 8/1973 | Putz | 330/149 |
| 3,900,823 | 8/1975 | Sokal et al. | 330/149 |
| 4,068,186 | 1/1978 | Sato et al. | 330/149 |
| 4,122,399 | 10/1978 | Heiter et al. | 330/149 |
| 4,465,980 | 8/1984 | Huang et al. | 330/149 |
| 4,532,477 | 7/1985 | Green, Jr. et al. | 330/149 |
| 4,600,892 | 7/1986 | Wagner et al. | 330/149 |

*Primary Examiner*—Steven Mottola
*Attorney, Agent, or Firm*—Rothwell, Figg, Ernst & Kurz

[57] ABSTRACT

A high frequency amplifier circuit comprises an amplitude characteristic correction circuit and a phase characteristic correction circuit for compensating the nonlinearity of the input-output characteristics of the amplifier. The amplitude characteristic correction circuit varies the drain voltage or the collector voltage of the amplifier in accordance with the envelope level of an input signal in such a manner that the relationship between the amplitude of the output of the amplifier and the amplitude of the input signal has linearity. On the other hand, the phase characteristic correction circuit provides a quantity of phase shift to the input signal in accordance with the envelope level of the input signal, and the phase-shifted input signal is applied to the amplifier in such a manner that the phase of the output of the amplifier and that of the input signal coincide with each other.

8 Claims, 11 Drawing Sheets

FIG. 5 (a) (PRIOR ART)
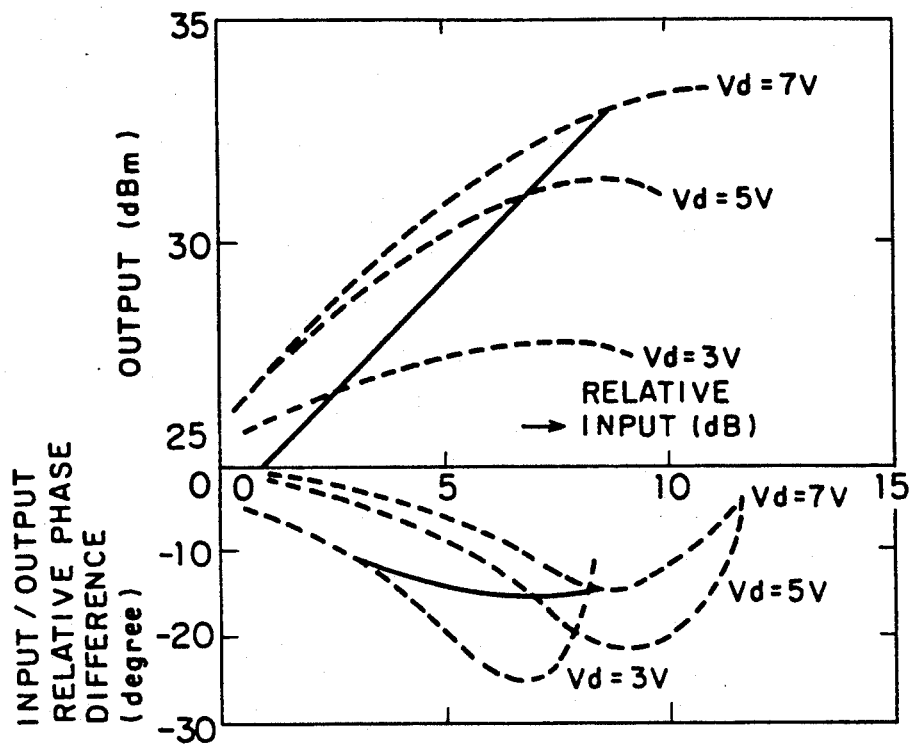
FIG. 5 (b) (PRIOR ART)
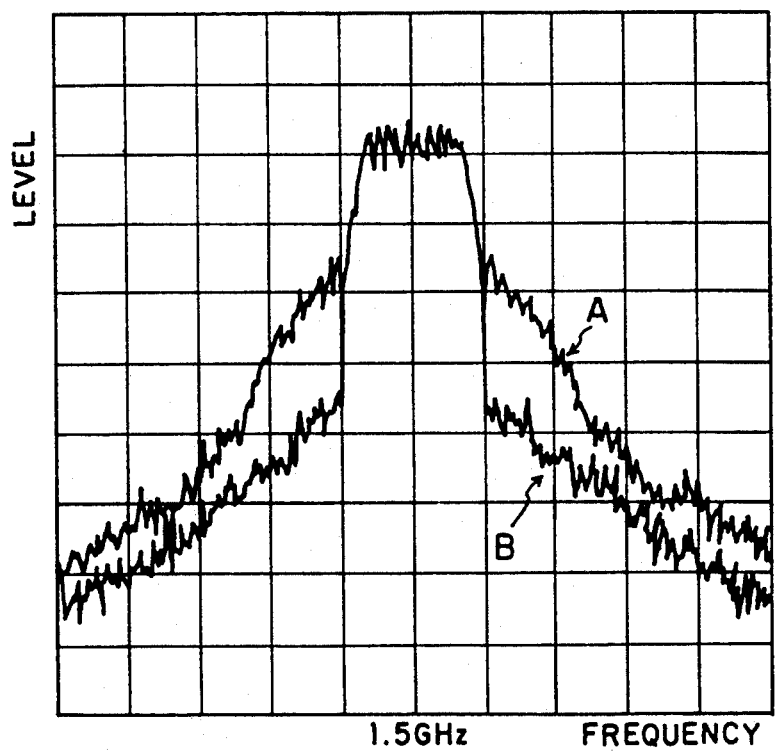

FIG. 7B

| ENVELOPE LEVEL | 53a | 53b | 54a | 54b | AMOUNT OF SHIFT |
|---|---|---|---|---|---|
| A1 | X | X | X | X | $\alpha_1$ |
| A2 | X | X | X | X | $\alpha_2$ |
| ⋮ | ⋮ | ⋮ | ⋮ | ⋮ | ⋮ |
| An | X | X | X | X | $\alpha_n$ |

60 →

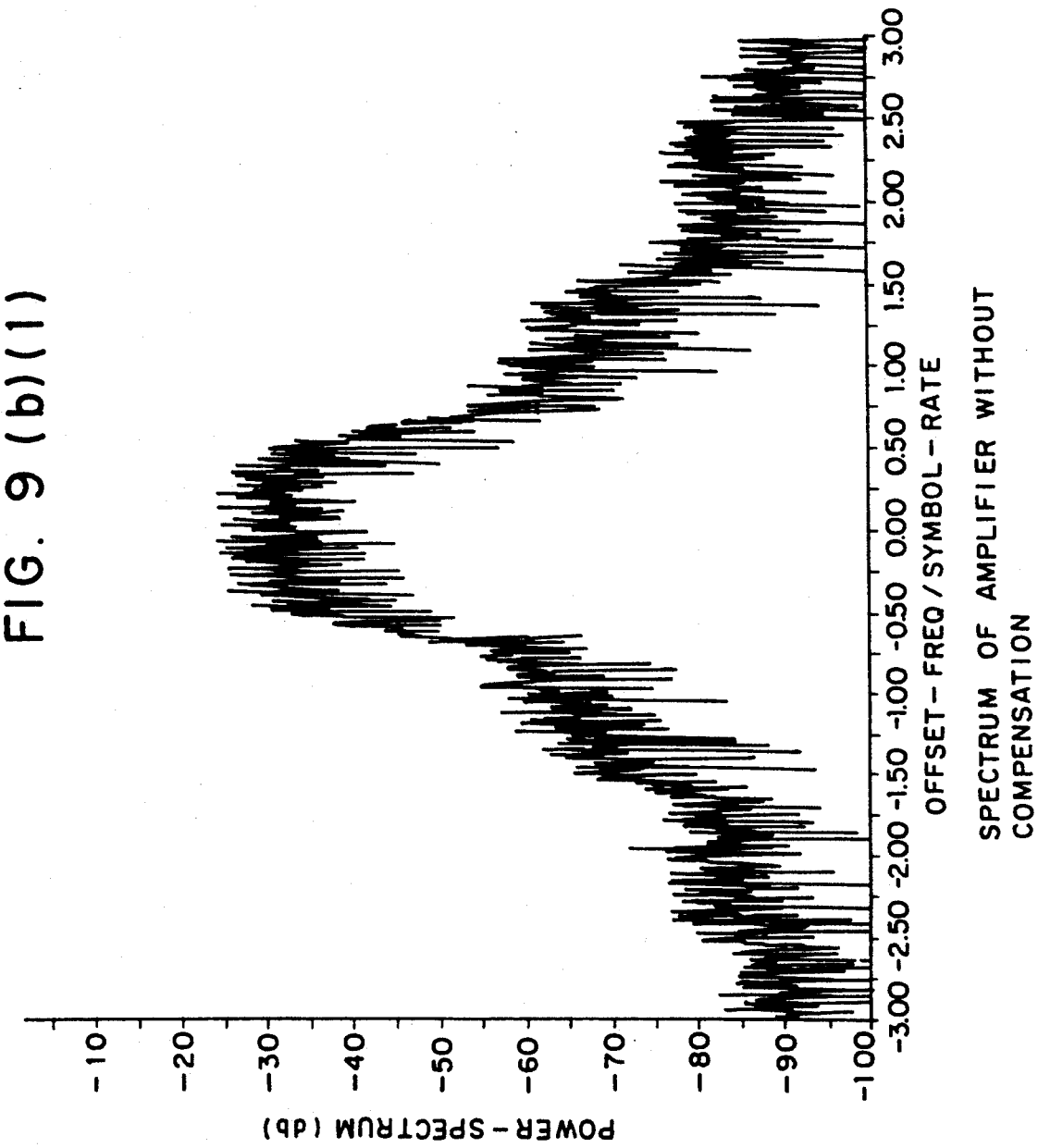

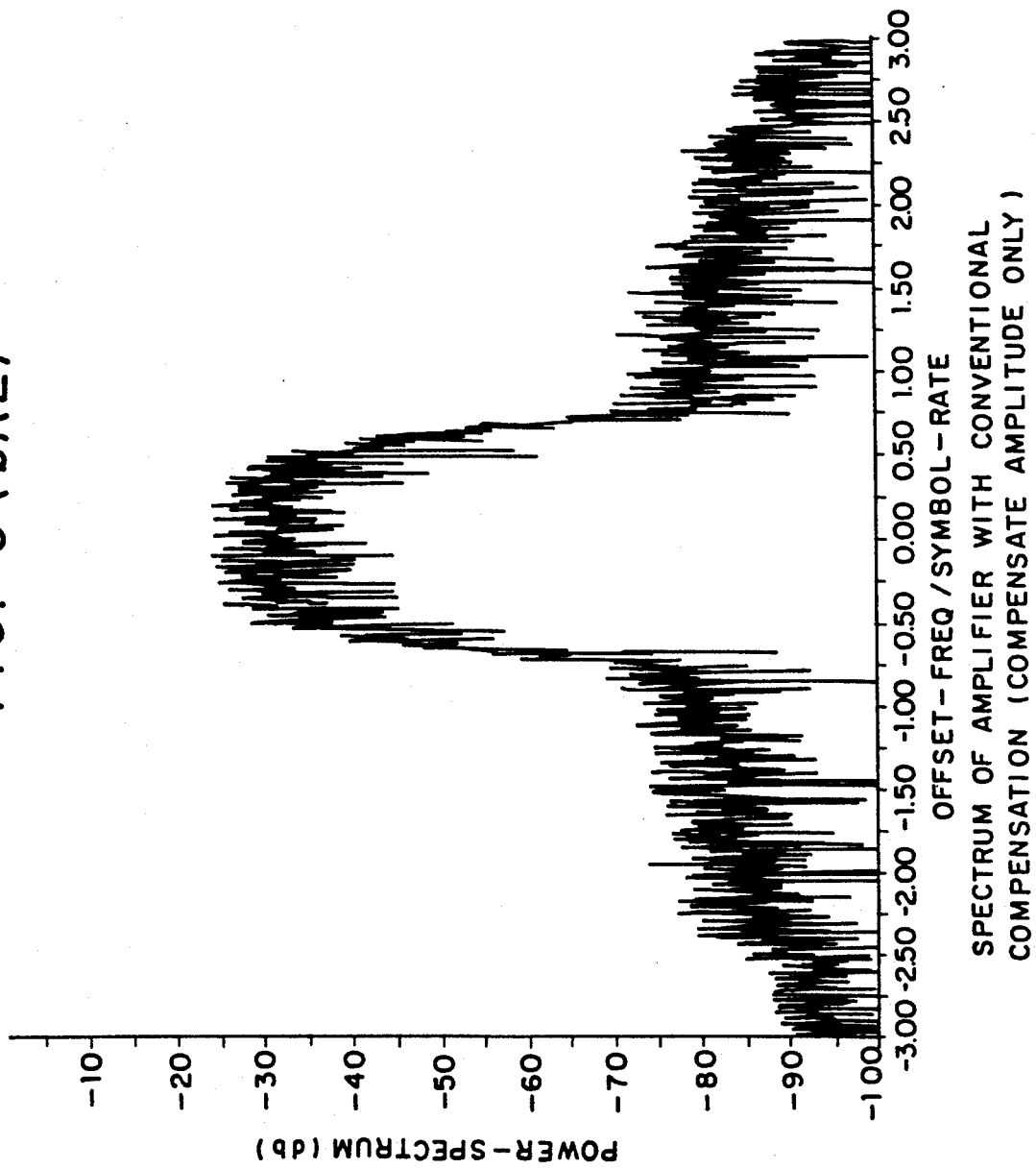

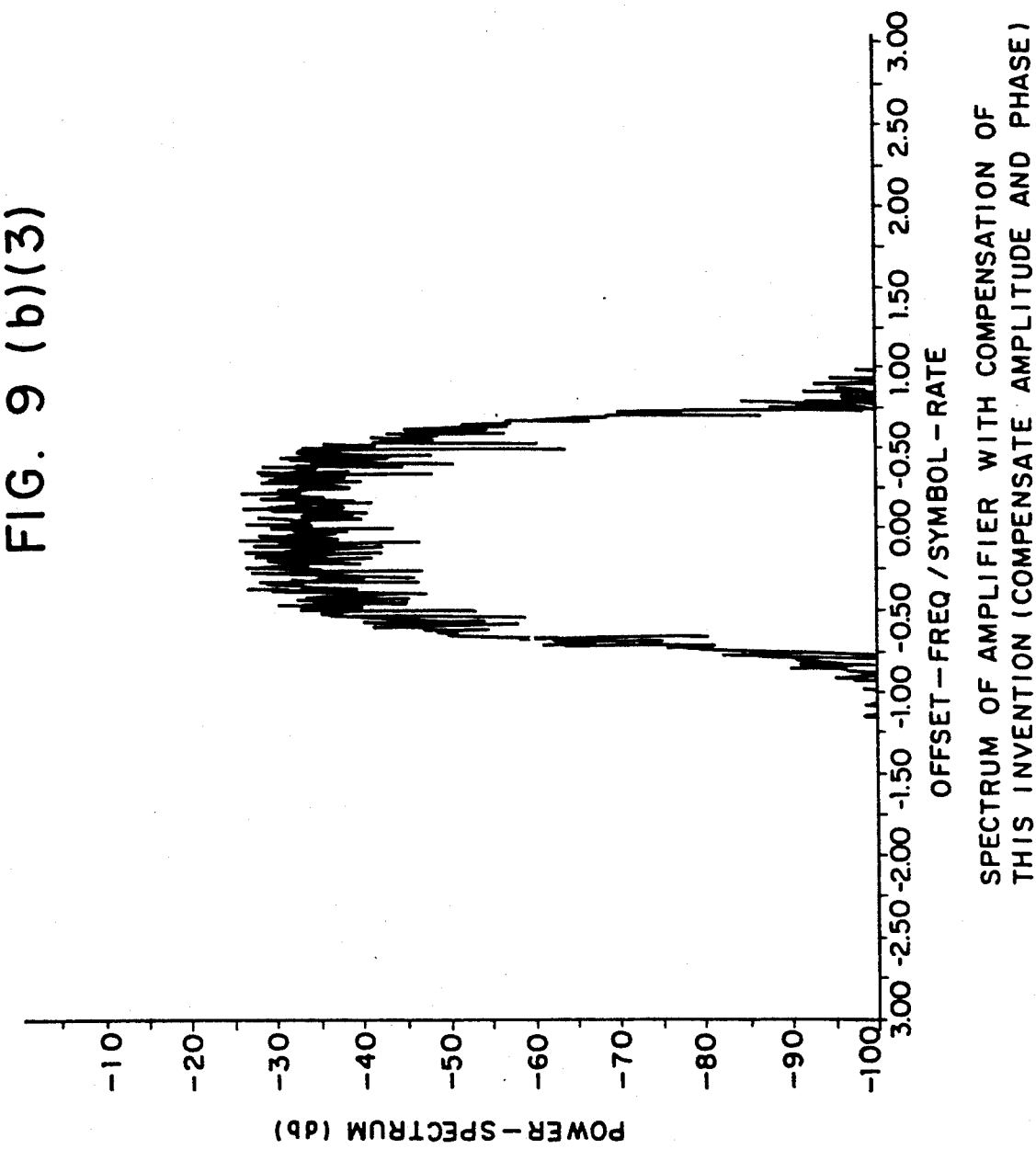

AMPLIFIER CIRCUIT WITH CORRECTION OF AMPLITUDE AND PHASE DISTORTIONS

BACKGROUND OF THE INVENTION

1. Field of the Invention

This invention relates to a linear amplifier which is used in a high frequency band and used mainly as a power amplifier.

2. Description of the Prior Art

A recent trend in communication system design has been to narrow the effective frequency band of a channel in order to attempt effective utilization of the frequency spectrum. When a frequency band of a channel is narrowed, deterioration of a transmission signal becomes a problem owing to the nonlinear characteristics of amplifiers typically used in such communication systems. The reason is that the nonlinear amplitude output characteristic of an amplifier (AM/AM) and drifting of an output signal phase of an amplifier relative to an input signal phase (AM/PM) generates intermodulation components of odd orders such as the third order, the fifth order and the like, and consequently interference with adjacent channels is easily generated.

Particularly in transmission systems utilizing narrow band QPSK (quaternary phase shift keying) modulation such as mobile telephone communications, it is necessary to use the nonlinear range of power amplifiers because of the required data transmission speeds, e.g. a wide dynamic range is required (on the order of 17 dB). Further, in terms of operating performance, the most efficient amplifier operation occurs in the saturation or nonlinear range of the input/output characteristics.

FIG. 1(a) is a circuit diagram showing a simplified constitution, for example, of a conventional amplifier using a field effect transistor (FET) shown in chapter 8 of the book "Microwave" (written by Eitaro Abe) published by Tokyo University Publishing Society. In FIG. 1(a), reference numeral 1 is an input terminal, 2 is an output terminal, 100 is a FET, 101 is an input impedance matching circuit, 102 is an output impedance matching circuit, 103 is a gate bias circuit, 104 is a gate voltage supply terminal, 105 is a drain bias circuit, and 106 is a drain voltage supply terminal. This FET amplifier exhibits input/output characteristics as shown in FIG. 2. Though the characteristic is linear within a small input region, it does not remain linear as the input increases, resulting in generation of output distortions. Though the output phase exhibits a small change with respect to the input phase a small input region similarly, it varies largely as the input power increases. In this way, distortions are generated in both the amplitude and phase of an input signal in a region where an input power is large. In a quaternary phase shift keying (QPSK) modulation method, a type of phase modulation method, since the amplitude of an input signal varies a modulation signal, the linearity of the amplifier is particularly important. FIG. 3 indicates the spectrum of an output wave signal obtained when a QPSK wave signal is inputted to an amplifier having a characteristic as shown in FIG. 2, from which it is seen that the quantity of leakage power interfering with adjacent channels (having adjacent frequency bands) is considerably large.

It is also possible to employ a bipolar transistor in place of the FET 100. A constitution of an amplifier using a bipolar transistor is shown in FIG. 1(b). In FIG. 1(b), reference numeral 107 is a bipolar transistor (an NPN type is illustrated in the figure) and reference numerals 101a to 106a are portions corresponding to portions 101 to 106 in FIG. 1(a). Specifically, reference numeral 101a is an input impedance matching circuit, 102a is an output impedance matching circuit, 103a is a base bias circuit, 104a is a base voltage supply terminal, 105a is a collector bias circuit, and 106a is a collector voltage supply terminal. The circuit shown in FIG. 1(b) operates in the same way as the circuit shown in FIG. 1(a), and its characteristic shows the same trend as that of the circuit shown in FIG. 1(a).

A conventional method for compensating a nonlinear characteristic of an amplifier is implemented by the high frequency amplifier circuit shown in Japanese Patent Disclosure Publication No. 274906/1987 or paper B-539 in the collection for the lecture at the national conference of The Institute of Electronics, Information and Communication Engineers (Japan) held in the fall of 1989. This amplifier circuit varies its drain voltage in proportion to an envelope level of an input signal and has the feature that even if the amplifier has a large distortion such as a class F amplifier, it exhibits an amplifier characteristic having good linearity and its power efficiency is thus enhanced irrespective of changes in the envelope level of its input signal.

FIG. 4 is a circuit diagram showing such a conventional high frequency amplifier circuit which so compensates a non-linear characteristic. In FIG. 4, reference numeral 1 is an input terminal, 2 is an output terminal, 3 is a DC voltage supply terminal, 10 is an amplifier, 20 is an envelope detector circuit, 30 is a non-linearity control circuit, and 40 is a voltage variable DC-DC converter. The above-mentioned envelope detector circuit 20, non-linearity control circuit 30 and voltage variable DC-DC converter 40 constitute an amplitude characteristic correction means. The non-linearity control circuit 30 is a circuit which outputs a drain voltage in accordance with an envelope level of an input signal based on look-up table data of an input-output amplitude characteristic at the time when a drain voltage of the amplifier 10 is varied. The look-up table is implemented by a ROM (Read Only Memory) or the like. In other words, the drain voltage values for which the input-output amplitude characteristics shown by the dashed lines in the upper graph of FIG. 5(a) become a straight line are stored in the ROM corresponding to the envelope levels of the input signal. The value of the drain voltage in accordance with the envelope level at that time is outputted by the control circuit 30. The voltage variable DC-DC converter 40 is a circuit which converts an output voltage from the non-linearity control circuit 30 into a corresponding drain voltage for operating the amplifier 10, and needs to operate at a high speed in order to follow changes in the envelope level of the input signal. In this circuit, even if the amplifier 10 is an amplifier having a large distortion such as a class F amplifier which characteristic is shown by the dashed lines in FIG. 5(a), the input-output amplitude characteristic can be made to be a substantially straight line by controlling the drain voltage in accordance with the envelope level of the input signal, and consequently the amplifier 10 can be operated linearly while retaining a high power efficiency. Also, the input-output phase characteristic is improved over the conventional amplifier, as shown by the solid line in the lower graph of FIG. 5(a). FIG. 5(b) shows the frequency spectrum of an output wave signal for input signal of a center frequency of 1.5 GHz. In FIG. 5(b), A is a spectrum based on the amplifier 10 without drain voltage control, and B is a spectrum in the case where the high frequency amplifier circuit shown in FIG. 4 is employed. It is seen that the spectrum B based on the high frequency amplifier shown in FIG. 4 exhibits lower levels of frequency distortion than the spectrum A and consequently, the leakage power leaked to adjacent channels becomes small.

However, in such a conventional high frequency amplifier as shown in FIG. 4, there is a problem that though the amplitude-amplitude (AM/AM) conversion of the amplifier can be corrected because the amplitude characteristic of the amplifier is made substantially linear, the amplitude-phase shift (AM/PM) conversion can not be corrected because the phase characteristic is not made flat (constant). For this reason, deterioration in the spectrum caused by phase distortions can not be prevented. Accordingly, a sufficient characteristic can not be obtained by this high frequency amplifier circuit in the case where leakage power leaked to adjacent channels is required to be very small.

SUMMARY OF THE INVENTION

This invention solves the problems described above, and it is an object of this invention to correct not only an AM/AM conversion but also an AM/PM conversion and make leakage power leaked to adjacent channels very small.

The high frequency amplifier circuit of this invention is provided with an amplitude correction circuit which varies a drain voltage or a collector voltage of an amplifier in accordance with the envelope level of an input signal of the amplifier and a phase characteristic correction circuit which is provided on the input side of the amplifier to vary a quantity of phase shift applied to the input signal in accordance with the envelope level of the input signal.

In this invention, the drain voltage or the collector voltage of the amplifier varies in accordance with the envelope level of the input signal and the amplitude characteristic of the amplifier is thus corrected so as to be a straight line by the amplitude correction circuit, and at the same time, a quantity of phase shift of the signal inputted to the amplifier varies in accordance with the envelope level of the input signal, by which the phase characteristic is corrected so as to be flat by the phase characteristic correction circuit, allowing AM/PM conversion of the amplifier to be corrected and leakage power leaked to adjacent channels to be virtually nullified.

BRIEF DESCRIPTION OF THE DRAWINGS

FIGS. 5(a) and 5(b) are characteristic diagrams showing the characteristics of the high frequency amplifier circuit shown in FIG. 4;

FIG. 7B is a chart showing the contents of circuit 60 of FIG. 6;

DETAILED DESCRIPTION OF THE PREFERRED EMBODIMENT

Figure 1A:
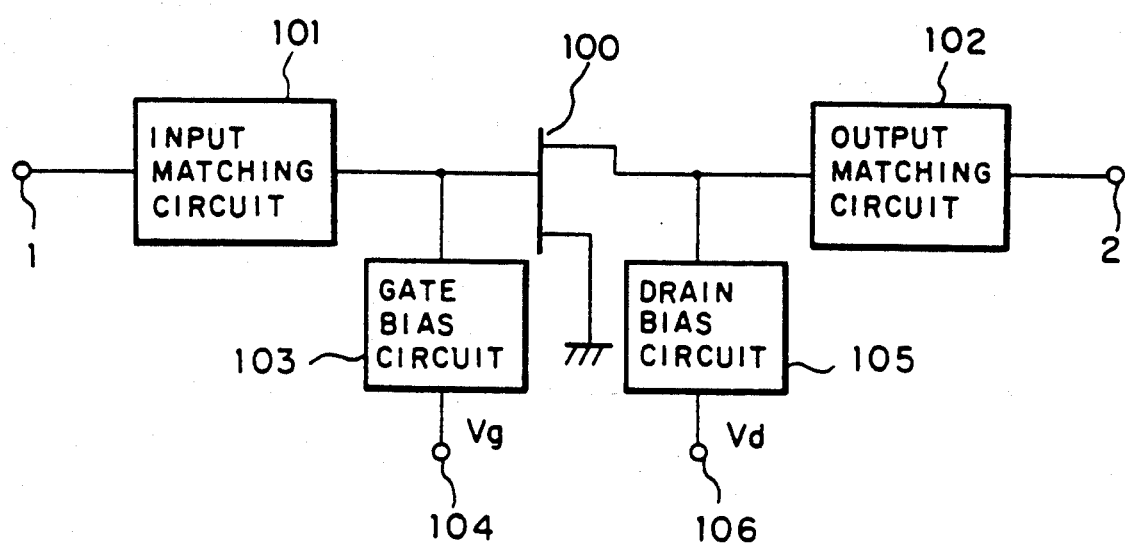
FIGS. 1(a) and 1(b) are circuit diagrams showing a conventional high frequency amplifier.
Figure 6:
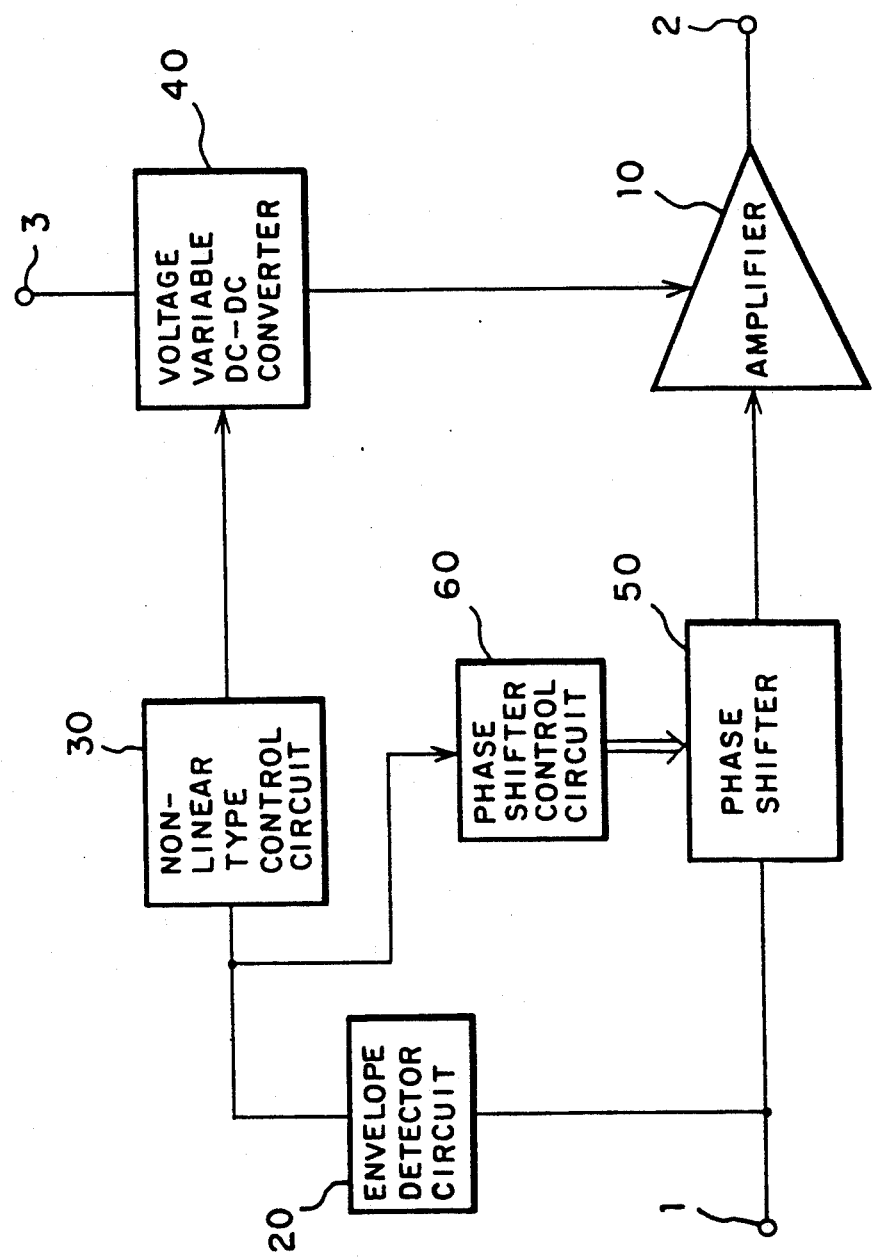
FIG. 6 is a block diagram showing a high frequency amplifier circuit according to an embodiment of this invention.

FIG. 6 is a block diagram showing an embodiment according to this invention. In FIG. 6, reference numerals 1 to 3, 10, 20, 30 and 40 denote the same components as those shown in FIG. 4. Reference numeral 50 is a phase shifter and 60 is a phase shifter control circuit. The envelope detector circuit 20, the phase shifter 50, and the phase shifter control circuit 60 constitute a phase characteristic correction circuit. The phase shifter control circuit 60 outputs a control voltage which controls the phase shifter 50 in accordance with the envelope level of an input signal generated by the envelope detector circuit 20. Incidentally, the circuits shown in FIG. 1(a) and FIG. 1(b) can be employed as the amplifier 10.

Figure 4:
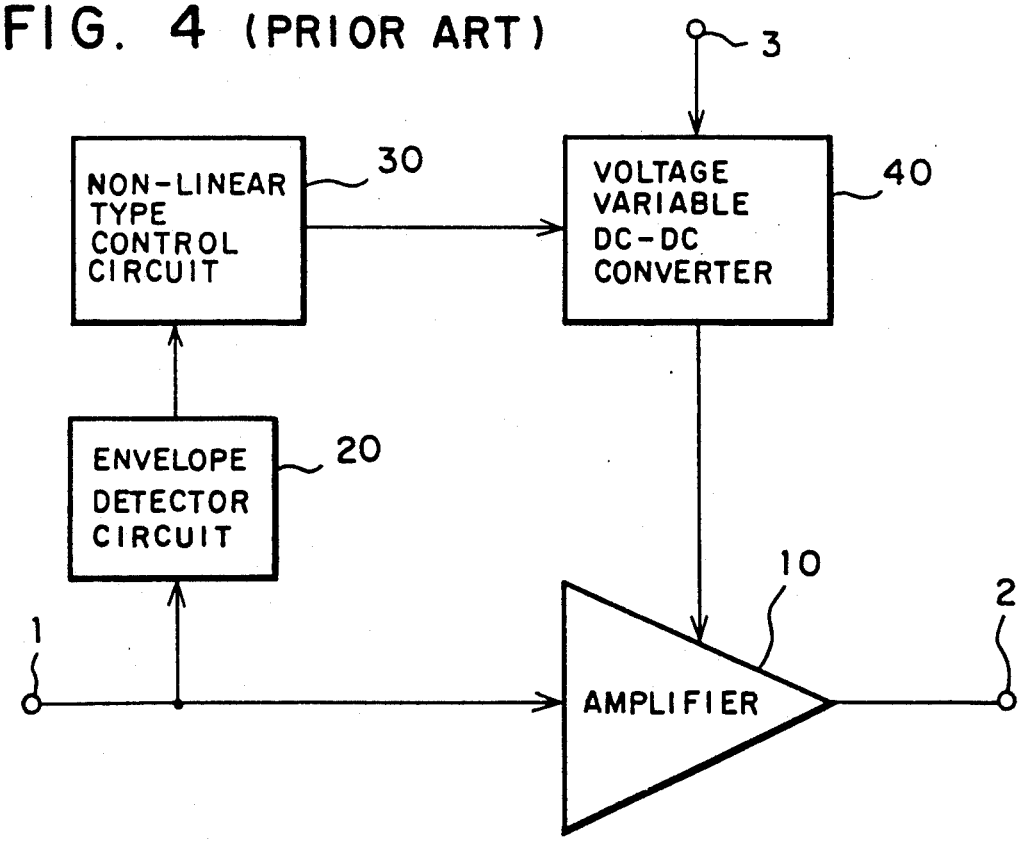
FIG. 4 is a block diagram showing a conventional high frequency amplifier circuit for AM/AM compensation.

The input-output amplitude characteristic of the amplifier can be corrected so as to be substantially linear in the same way as the conventional high frequency amplifier circuit described in FIG. 4 because its drain voltage is varied by the non-linearity control circuit 30 and the voltage variable DC-DC converter 40 in accordance with the envelope level of the input signal generated in the detector circuit 20, allowing AM-AM conversion to be corrected.

On the other hand, the voltage applied to the phase shifter 50 is controlled in accordance with the envelope level of the input signal by the phase shifter control circuit 60 similar to the non-linearity control circuit 30 (that is, a ROM look-up table can be used as the phase shifter control circuit 60), by which a quantity of phase shift is varied to allow the input-output phase characteristic of the amplifier 10 to be made flat and AM-PM conversion to be corrected.

Figure 7A:
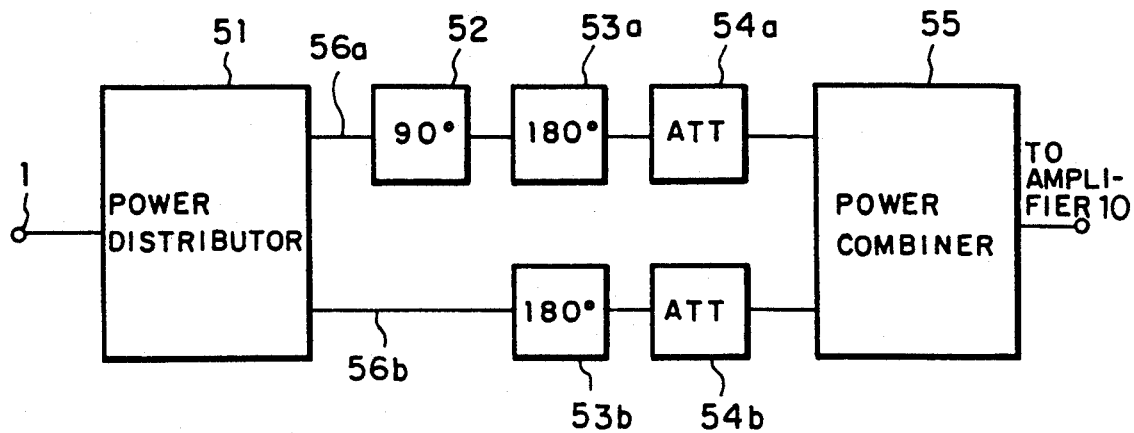
FIG. 7A is a constitutional block diagram showing one example of the constitution of a phase shifter shown in FIG. 6.
Figure 8:
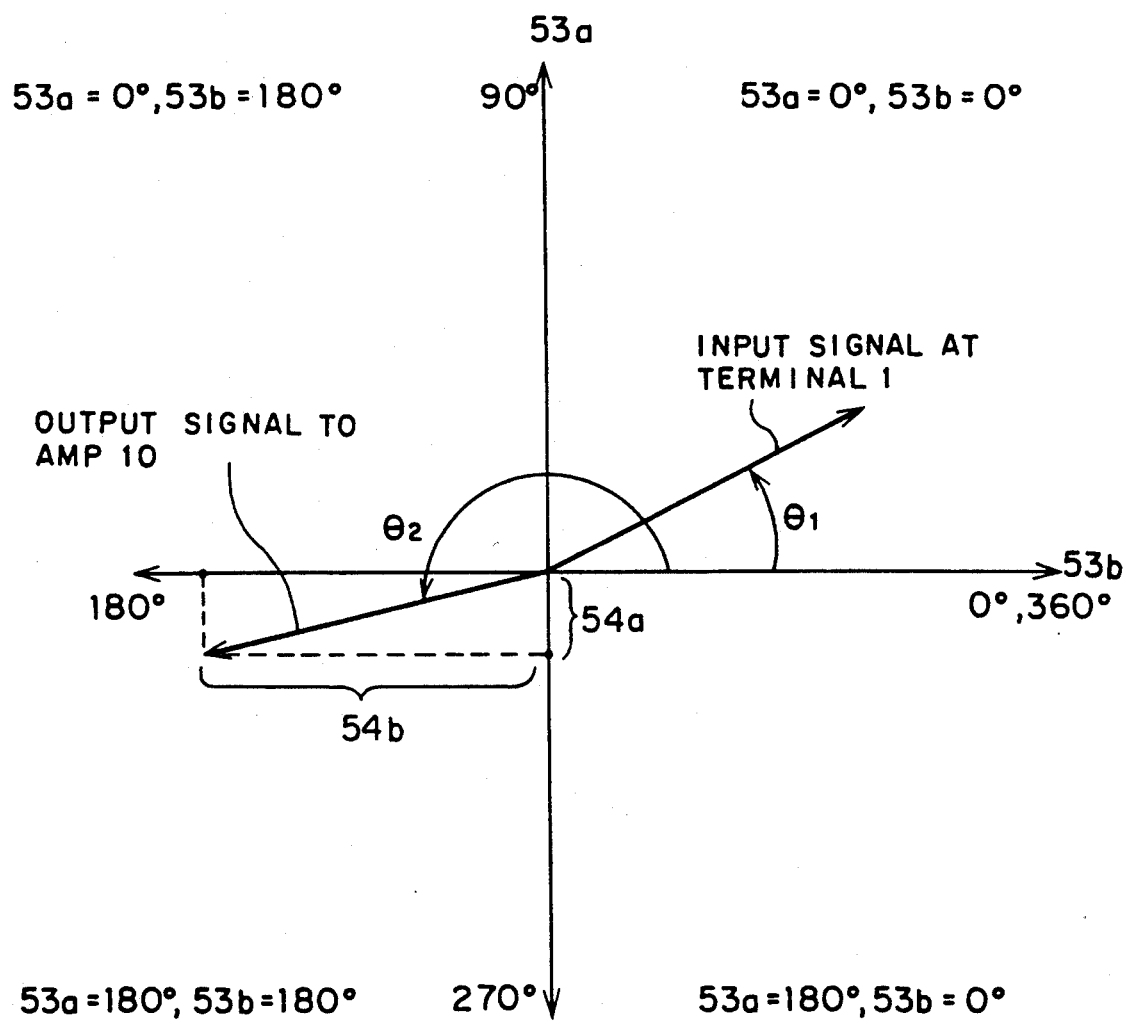
FIG. 8 is an explanatory graph showing the operation of the phase shifter.

FIG. 7A is a constitutional diagram showing an example of the phase shifter 50 used in this invention, and FIG. 7B shows an example of the contents of a ROM used as control circuit 60. Specifically, the look-up table stores values for the 180° phase shifters and the attenuators for each detected envelope level $A_i$, which values will produce an output signal having a phase shift $a_i$ relative to the input signal. The phase shifter 50 is a vector synthesis-type phase shifter which is constituted by a power distributor 51, a 90° phase shifter 52, 180° phase shifters 53a, 53b, variable attenuators 54a, 54b and a power combiner 55. The 180° phase shifters 53a, 53b each can change over between 0° and 180° by a voltage applied thereto from the phase shifter control circuit 60, and similarly the variable attenuators 54a, 54b each can vary a quantity of attenuation by a voltage applied thereto from the phase shifter control circuit 60. The power distributor 51 splits the power of the input signal equally over lines 56a and 56b. The power combiner 55 combines the outputs of the two variable attenuators 54a, 54b as vectors, as shown in FIG. 8. The phase shifter control circuit 60 controls the 180° phase shifters 53a, 56b and the variable attenuators 54a, 54b, by which the phase shifter 50 can obtain any arbitrary quantity of phase shift α as shown in FIG. 8, where an input signal of phase $\theta_1$ is shifted to an output signal of phase $\theta_2$ ($\alpha = \theta_2 - \theta_1$).

Figure 9:
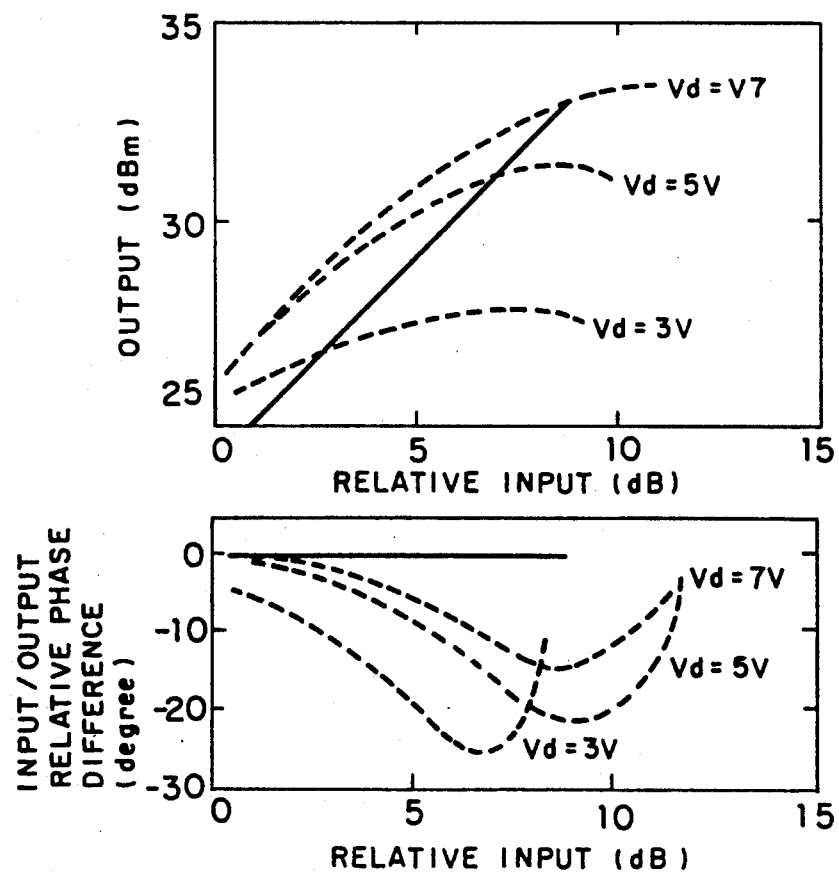
FIG. 9(a) is a characteristic diagram showing the characteristics of a high frequency amplifier circuit according to this invention.
FIGS. 9(b)(1),9(b)(2) and 9(b)(3) are characteristic graphs for comparing the performance of the present invention with that of the prior art.

In other words, in the case where a ROM is employed as the phase shifter control circuit 60, phase shifter indicating quantities are stored in the ROM corresponding to the envelope level of the input signal for shifting the phase of the input signal (by setting the values of the voltages applied to the 180° phase shifters 53 and the variable attenuators 54) so that input-output phase characteristic of the amplifier 10 shown by the dashed lines in the lower graph of FIG. 9(a) becomes flat as shown by the solid line. The phase shifter indicating quantity in accordance with the envelope level of the input signal at that time is outputted from the ROM in the form of control values for 53a, 53b, 54a and 54b, and the phase shifter 50 accordingly shifts the phase of the input signal in accordance with the phase shift indicating quantity.

The two solid lines shown in FIG. 9(a) show the input-output amplitude characteristic and the input-output phase characteristic of the high frequency amplifier circuit constituted as described above. The input-output amplitude characteristic is substantially linear in the same way as the conventional high frequency amplifier circuit, and moreover, the input-output phase characteristic has a relative phase difference which is flat and substantially 0°, different from the conventional high frequency amplifier circuit (See FIG. 5(a)). FIGS. 9(b)(1) to 9(b)(3) are diagrams showing the various spectra of the transmitting wave for the 3 cases described above, through simulation.

FIG. 9(b)(1) shows a spectrum for amplifier operation without any nonlinearity compensation, FIG. 9(b)(2) shows a spectrum for the conventional amplifier circuit shown in FIG. 4 with amplitude compensation only, and FIG. 9(b)(3) shows a spectrum for the amplifier circuit according to this invention as shown in FIG. 6. The provision of the phase shifter 50 and the control of a quantity of phase shift of the input signal in accordance with the amplitude of the input signal allows the leakage power leaked to adjacent channels to be made very small. The amplifier circuit according to this invention is, therefore, effective for use in a narrow-band system having narrow channel widths, such as mobile telephone communication systems.

Figure 1B:
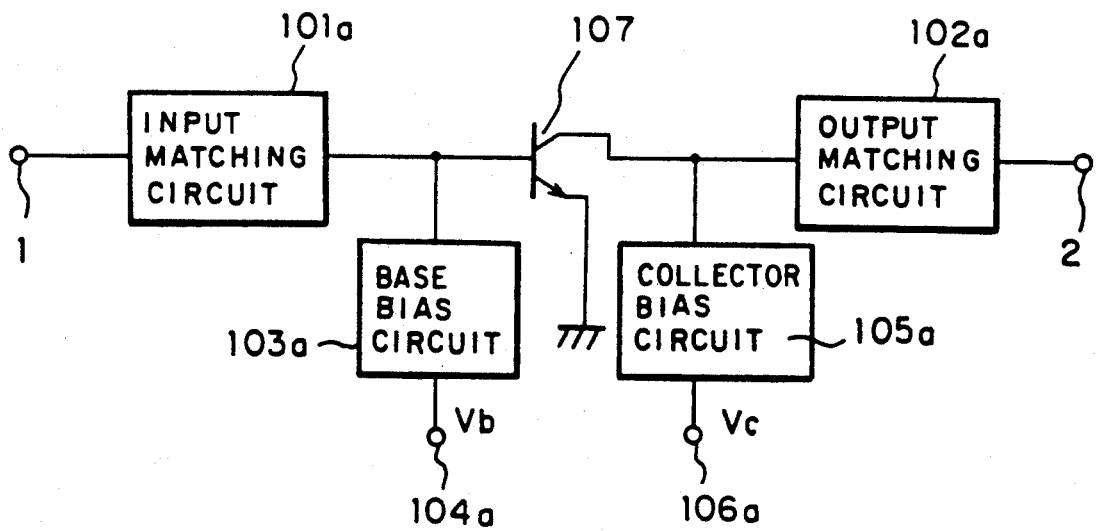
Figure 2A:
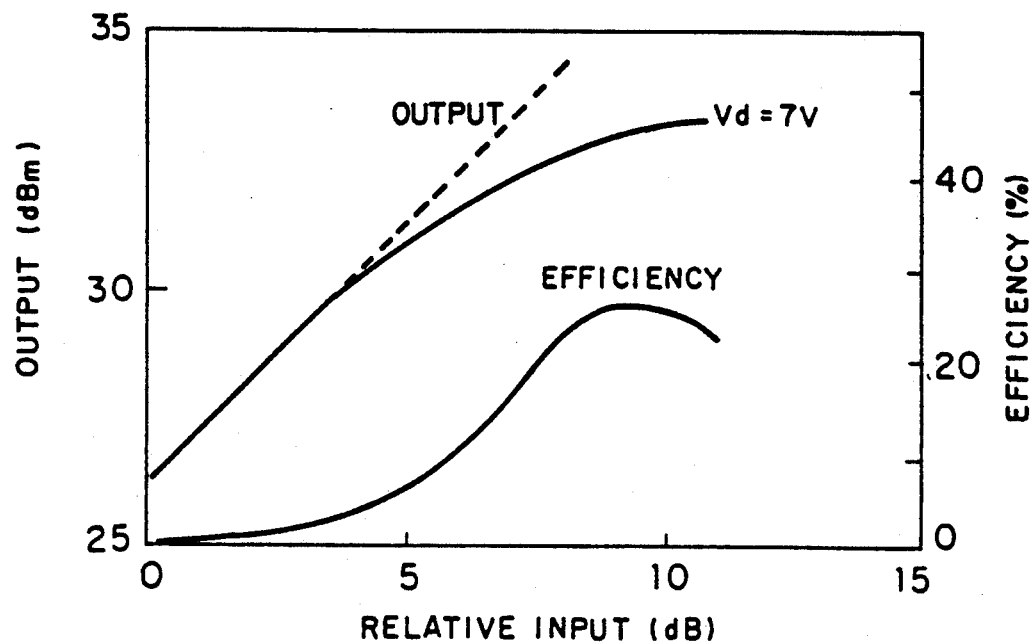
FIG. 2(a) and 2(b) are characteristic diagram showing an input-output amplitude characteristic and an input-output phase characteristic of the amplifier of FIG. 1.
Figure 2B:
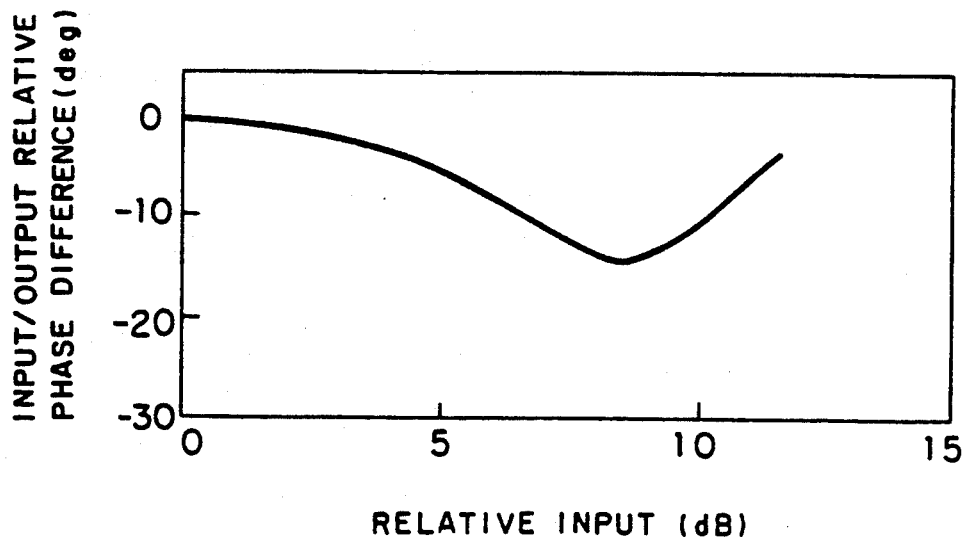
Figure 3:
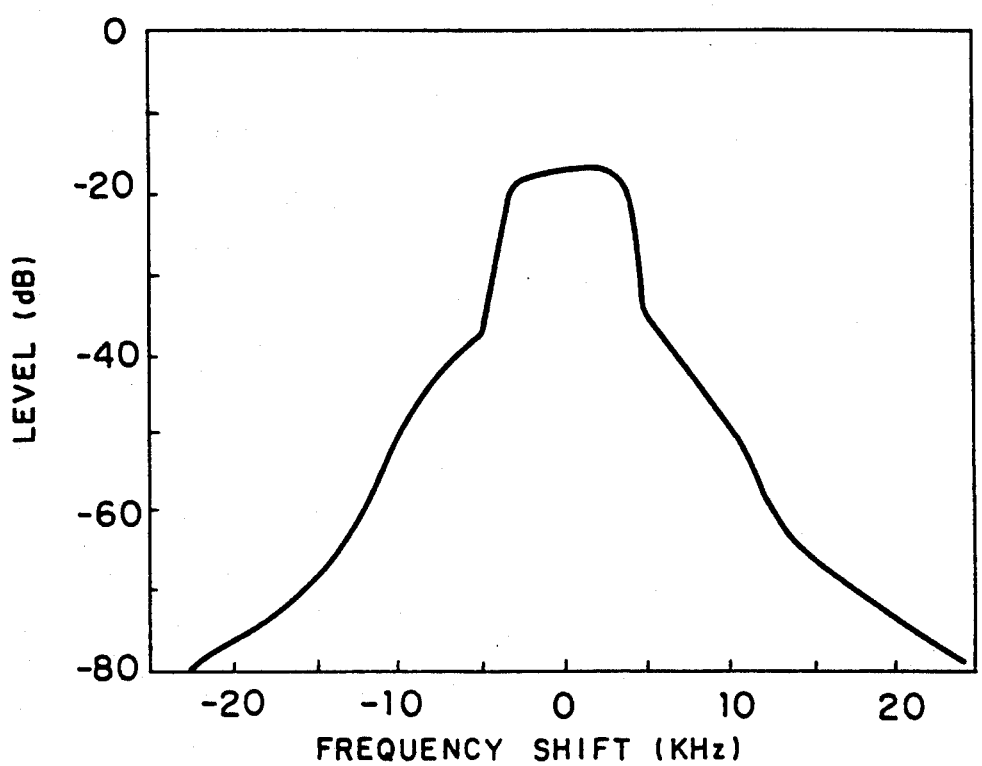
FIG. 3 is a characteristic diagram showing the frequency spectrum of an output signal of a conventional high frequency amplifier.

Although a high frequency amplifier circuit using an FET as an amplifying element is described in the above-mentioned embodiment, it is apparent that even in the case where a bipolar transistor as shown in FIG. 1(b) is employed, the high frequency amplifier circuit operates in the same way as the above-mentioned embodiment and achieves the same effect.

As described above, according to this invention, the provision of an amplitude characteristic correction circuit which varies a drain voltage or a collector voltage of an amplifier in accordance with envelope level of the input signal and a phase characteristic correction circuit which is provided on the input side of the amplifier to vary a quantity of phase shift applied to the input signal in accordance with the envelope level of the input signal permits the amplitude distortion and the amplitude-/phase shift characteristic of the amplifier to be corrected and leakage power leaked to adjacent channels to be made very small.

What is claimed is:

1. An amplifier circuit, comprising:
an amplifier for amplifying an input signal and generating an output signal corresponding thereto, said amplifier exhibiting nonlinear amplitude and phase characteristics;
detector means for detecting a parameter of said input signal and developing a detection signal corresponding thereto, said detection signal being independent of parameters of said output signal;
amplitude characteristic correction means for varying a supply voltage of said amplifier in accordance with said detection signal so as to correct said nonlinear amplitude characteristic; and
phase characteristic correction means for varying a phase of said input signal in accordance with said detection signal so as to correct said nonlinear phase characteristic.

2. An amplifier circuit, comprising:
an amplifier for amplifying an input signal and generating an output signal corresponding thereto, said amplifier exhibiting nonlinear amplitude and phase characteristics;
detector means for detecting a parameter of said input signal and developing a detection signal corresponding thereto;
amplitude characteristic correction means for varying a supply voltage of said amplifier in accordance with said detection signal so as to correct said nonlinear amplitude characteristic; and
phase characteristic correction means for varying a phase of said input signal in accordance with said detection signal so as to correct said nonlinear phase characteristic, wherein said detector means comprises an envelope detector for detecting the envelope of said input signal.

3. An amplifier circuit, comprising:
an amplifier for amplifying an input signal and generating an output signal corresponding thereto, said amplifier exhibiting nonlinear amplitude and phase characteristics;
detector means for detecting a parameter of said input signal and developing a detection signal corresponding thereto;
amplitude characteristic correction means for varying a supply voltage of said amplifier in accordance with said detection signal so as to correct said nonlinear amplitude characteristic; and
phase characteristic correction means for varying a phase of said input signal in accordance with said detection signal so as to correct said nonlinear phase characteristic; wherein said detector means comprises an envelope detector for detecting the envelope of said input signal; and said amplitude characteristic correction means comprises a nonlinearity control circuit for outputting a control voltage in accordance with said detection signal, and a variable supply voltage converter for applying a supply voltage to said amplifier in accordance with said control voltage.

4. An amplifier circuit according to claim 3, wherein said amplifier comprises an FET, and said supply voltage is a drain voltage of said FET.

5. An amplifier circuit according to claim 3, wherein said amplifier comprises a bipolar transistor, and said supply voltage is a collector voltage of said bipolar transistor.

6. An amplifier circuit according to claim 3, wherein said phase characteristic correction means comprises a phase shifter control circuit for outputting phase shift information in accordance with said detection signal, and a phase shifter for shifting the phase of said input signal in accordance with said phase shift information.

7. An amplifier circuit according to claim 6, wherein the phase of said input signal is shifted by an amount such that the phase of said output signal coincides with the original phase of said input signal.

8. An amplifier circuit according to claim 6, wherein said phase shifter control circuit comprises a look-up table memory.

* * * * *